(12) United States Patent
Peng

(10) Patent No.: US 6,291,854 B1
(45) Date of Patent: Sep. 18, 2001

(54) ELECTRICALLY ERASABLE AND PROGRAMMABLE READ ONLY MEMORY DEVICE AND MANUFACTURING THEREFOR

(75) Inventor: Nai-Chen Peng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/474,997

(22) Filed: Dec. 30, 1999

(51) Int. Cl.[7] .................... H01L 29/788; H01L 21/336
(52) U.S. Cl. ....................... 257/315; 438/257; 438/264
(58) Field of Search .................... 438/264, 197, 438/211, 257; 257/317, 314, 315, 316, 321

(56) References Cited

U.S. PATENT DOCUMENTS

| | | |
|---|---|---|
| 5,872,036 | * 2/1999 | Sheu . |
| 5,874,337 | * 2/1999 | Geissler . |
| 6,066,875 | * 5/2000 | Chen . |
| 6,114,723 | * 9/2000 | Leu . |

* cited by examiner

Primary Examiner—Charles Bowers
Assistant Examiner—Evan Pert
(74) Attorney, Agent, or Firm—Jiawei Huang; J.C. Patents

(57) ABSTRACT

A fabrication method for an electrically erasable programmable read only memory is described in which the memory cell has a sharp-cornered polysilicon pillar in junction with the source region to enhance the source side Fowler-Nordheim tunneling effect. The fabrication method sequentially forms an oxide layer and a silicon nitride on a silicon substrate, and then patterns the oxide layer and the silicon nitride layer to form a plurality of trenches. A first doped polysilicon layer is then formed on the substrate and fills the trenches. A wet oxidation is then conducted to grow an oxide layer on the first doped polysilicon layer, from which a sharp-cornered doped polysilicon layer results. A first dielectric layer is further formed on the substrate and the doped polysilicon layer, followed by forming a floating gate on the first dielectric layer. After this, a second dielectric layer is formed on the substrate, covering the floating gate, and a control gate is formed on the second dielectric layer.

11 Claims, 4 Drawing Sheets

ELECTRICALLY ERASABLE AND PROGRAMMABLE READ ONLY MEMORY DEVICE AND MANUFACTURING THEREFOR

BACKGROUND OF THE INVENTION

1. Field of the Invention

The present invention relates to a semiconductor device. More particularly, the present invention relates to the fabrication of an electrically erasable and programmable read only memory device and a flash electrically erasable and programmable read only memory (EEPROM) device and the fabrication method therefor.

2. Description of the Related Art

A major component of an EEPROM device is the floating gate in which the potential at the floating gate controls the conductivity along a field effect transistor channel between the source and the drain regions. The floating gate is separated from the substrate by a gate oxide layer, for example, a silicon oxide. A control gate is generally positioned over the floating gate and is capacitively coupled with the floating gate through a dielectric layer. The control gate acts as a word line to enable the reading and writing of a single selected cell.

In general, two basic modes of operation are used for the programming and erasure of an EEPROM device. For the first mode of operation (prior art I), a selected memory cell is programmed (or erased) by holding the control gate, the source and the drain at appropriate voltages. This voltage condition causes hot electrons to be generated. Once these electrons gain sufficient energy and overcome the potential barrier of the gate oxide layer on the channel region (a portion of the substrate lying between the source and drain), they travel from the substrate and are injected into the floating gate by a mechanism referred to as "Channel Hot Electron Injection". If enough electrons are injected into the floating gate, the threshold voltage of the memory cell is increased and a logic state of "1" or "0" can be stored in the memory cell in the case of a programming operation. Correspondingly, during the erasure (or programming) operation, the control gate, the source and the drain are held at a potential that causes the electrons to tunnel back through the gate oxide layer by the so-called the Fowler-Nordheim tunneling phenomenon to the substrate, usually the source region, reversing the channel hot electron injection of the electrons into the floating gate of the above programming (or erasure) operation.

Another mode of operation (prior art II) for the EEPROM device uses Fowler-Nordheim tunneling to inject electrons into the floating gate and back into the substrate for both the programming and the erasure operations.

Reference is made to FIG. 1, which is a schematic, cross-sectional view showing an electrically erasable programmable read only memory device according to the prior art. As shown in FIG. 1, programming 114 of selective memory cells of an EEPROM device involves an application of a negative voltage on the control gate 108 and a positive voltage on the drain region 104, causing the electrons to be injected from the floating gate 106 through gate oxide (not shown in Figure) into the drain region 104.

Still referring to FIG. 1, during the erasure operation 112, a positive high voltage is applied on the control gate 108 while grounding the source 102 and substrate 100 to cause the electrons to be injected from the source to the floating gate. Table 1 summarizes the operation conditions for an EEPROM according to prior art I and prior art II. As shown in Table 1, a very high voltage (>20 volts) is required for the electrons to pass through the gate oxide layer for the EEPROM device following mode 1 of the erasing operation mentioned in the above (prior art I). Additionally, the erasure speed is low (about 100mS).

TABLE 1

The operation conditions an EEPROM device according to prior art I and prior art II.

|  | Operation | Control Gate | Drain Region | Source Region | Substrate |
|---|---|---|---|---|---|
| prior art I | Erasure | 20 V | Floating | Grounded | Grounded |
| prior art II | Erasure | 10–12 V | Floating | –5 V | –5 V |

There are several drawbacks associated with using a high voltage in an erasure operation as in prior art I. One such drawback lies in the needs for complicated circuits and manufacturing procedure for a high voltage operation (greater than or equal to 20 V). Furthermore, the high voltage charge pumping circuit required for this type of high voltage operation occupies a substantial area of the substrate.

Furthermore, in a high voltage metal-oxide-silicon-field-effect-transistor (MOSFET), a thick gate oxide layer and a long channel region are required to switch on and off the high voltage. If the thickness of the gate oxide layer is doubled, the manufacturing process becomes complicated. In addition, adjusting the dimension of a MOSFET is not simple. Yet another disadvantage associated with using a high voltage in an erasure operation is that the high voltage violates the low power dissipation requirement for the portable device.

Still referring to FIG. 1, alternatively, in the second mode of the flash EEPROM erasure operation (prior art II in Table 1), a negative voltage (approximately –5V) is applied to the source region 102 to reduce the voltage (can be reduced to about 10 V to 12V) that needs to be applied on the control gate 108. Applying a negative voltage to an N-type source region 102, however, would require formation of a deeper N-well region (not shown in Figure) underneath the shallow P-well region (not shown in FIG. 1, but located under the source region 102) in the substrate 100 to isolate the biased P-well region. The type of the design, nevertheless, occupies a significant area of the silicon substrate and also complicates the circuitry.

Generally speaking, the two modes of the operation require the high voltage pumping circuit, which occupies a substantial amount of wafer area. They also require many complicated periphery circuits to generate and control the negative voltage.

Furthermore, the EEPROM can be erased in a "flash" or in a bulk mode in which a large block of the memory cells or the entire array of memory cells can be erased simultaneously. This type of EEPROM is known as flash EEPROM. The block size is determined by how many source regions of the memory cells are connected together. In order to preserve the space on the silicon substrate of a flash memory cell, several hundreds to several thousands of the source regions are directly connected to the N+ junction to form a source line without the assistance of a contact window or metal for interconnection. However, when the device dimension is further scaled-down, the junction resistance increases dramatically because of a shallower junction. The high source side resistance further makes the cells, which are far from the source contact, have a positive voltage bias compared to the cells which are near the source contact and are well grounded. The positive voltage on the source side increases the threshold voltage of the memory cell. As a result, the capability to differentiate the information stored as "1" or "0" deteriorates.

SUMMARY OF THE INVENTION

Based on the foregoing, the present invention provides an electrically erasable programmable read only memory device and the method for making such a device in which a plurality of source regions is formed in the substrate. A first dielectric layer is then formed on the substrate covering the source region. After this, a floating gate is formed on the first dielectric layer. A plurality of drain regions is further formed in the substrate, followed by forming a second dielectric layer on the substrate. A control gate is subsequently formed on the second dielectric layer.

In addition, according to this version of the present invention, a sharp-cornered doped polysilicon pillar in conjunction with each source region is formed before covering the source region with the first dielectric layer or is formed during the formation of the source region.

According to the preferred embodiment of the present invention, the doped polysilicon pillar is preferably formed by sequentially forming a first oxide layer and a silicon nitride layer on the substrate. The silicon nitride layer and the first oxide layer are then pattered to form a plurality of trenches to expose the substrate surface where the source region is to be formed, subsequently. A polysilicon layer, which is doped with impurities, is then formed in and partially filling the trenches. After this, thermal oxidation is conducted to grow a second oxide layer on the first doped polysilicon layer and to drive in a portion of the dopants from the first doped polysilicon layer into the substrate to form the source region. Concurrently, a portion of the top of the first doped polysilicon layer near the silicon nitride layer becomes sharpen, resulting in a sharp-cornered polysilicon pillar on the source region.

Regarding the manufacturing of the floating gate, the drain region and the control gate, a first dielectric layer and a second doped polysilicon layer are sequentially formed on the substrate. The first dielectric layer and the second doped polysilicon layer are then patterned to expose the substrate surface where a plurality of drain regions are to be formed, subsequently. A portion of the second oxide layer on the first doped polysilicon layer is also exposed. The patterned second doped polysilicon layer serves as a floating gate of the memory cell. After this, an ion implantation is conducted in the substrate to form the drain regions using the patterned second doped polysilicon layer and the first dielectric layer as masks. Thereafter, a second dielectric layer and a patterned third doped polysilicon layer are sequentially formed on the substrate, wherein the patterned second doped polysilicon layer is the control gate.

According to the present version of the invention, the erasure voltage of an EEPROM device is lower while the erasure speed is increased. In the present invention, a sharp-cornered polysilicon pillar is formed in which the Fowler-Nordheim tunneling effect on the source region is enhanced to achieve a high-speed erasure operation. In the mean time, a lower erasure voltage is required at the control gate because it is easier for electrons to pass through the sharp-cornered polysilicon pillars, The sharp-cornered polysilicon pillar, which is in conjunction with the source region, also lowers the source-side resistance of a flash memory cell.

BRIEF DESCRIPTION OF THE DRAWINGS

The accompanying drawings are included to provide a further understanding of the invention, and arc incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1:
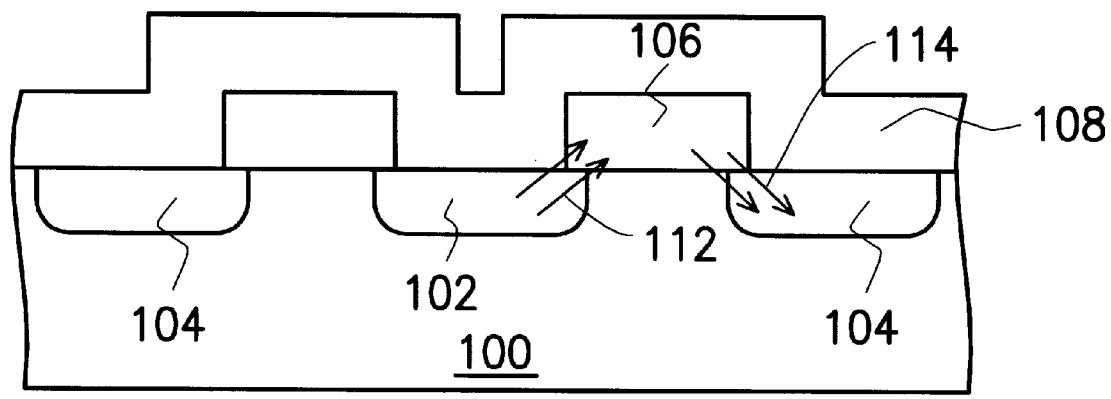
FIG. 1 is a schematic, cross-sectional view showing an electrically erasable programmable read only memory device according to the prior art.
Figure 2:
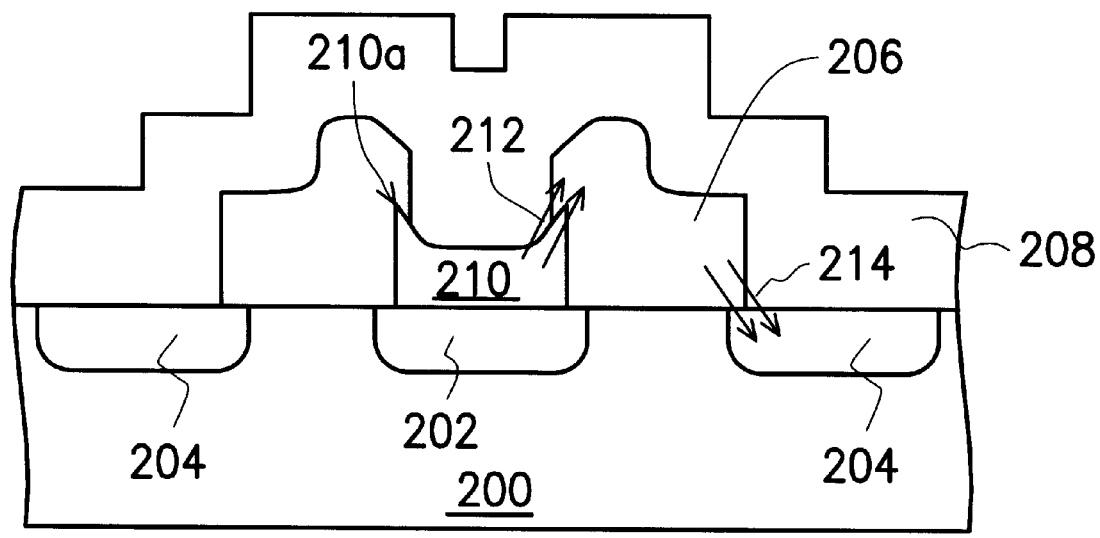
FIG. 2 is a schematic, cross-sectional view showing the electrically erasable programmable read only memory device according to the preferred embodiment of the present invention.

FIG. 2 is a schematic, cross-sectional view showing an electrically erasable programmable read only memory device according to the preferred embodiment of the present invention. According to FIG. 2, the electrically erasable programmable read only memory device of the present invention comprises a substrate 200, a control gate 208, a floating gate 206, a source region 202 and a drain region 204. Comparing the EEPROM device of the present invention as shown in FIG. 2 to the EEPROM device of the prior art shown in FIG. 1, the greatest difference between the two designs is the presence of a sharp-cornered 210a doped polysilicon layer or pillar 210 on the source region 202. Electrons can pass through the sharp corner more easily to achieve a high-speed erasure operation 212, wherein the programming operation 214 is achieved by passing the electrons from the floating gate 206 to the drain region 204. Since the movements of the electrons in and out of the floating gate 206 is facilitated by the sharp-cornered 210a doped polysilicon pillar 210, the erasure voltage at the control gate 208 is also reduced dramatically.

FIGS. 3A to 3F are schematic, cross-sectional views showing the manufacturing of the electrically erasable programmable read only memory device according to the preferred embodiment of the present invention.

Figure 3A:
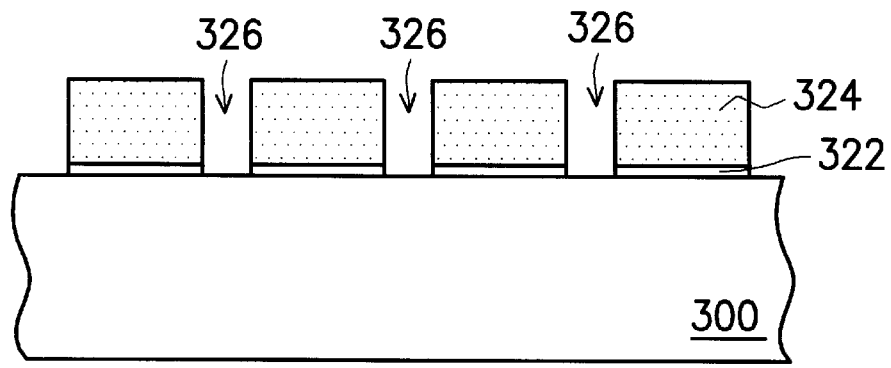
FIGS. 3A to 3G are schematic, cross-sectional views showing the manufacturing of the electrically erasable programmable read only memory device according to the preferred embodiment of the present invention.

Referring to FIG. 3A, thermal oxidation is conducted on a substrate 300, for example, a silicon substrate, to grow a first oxide layer 322 of about 100 angstroms to about 300 angstroms thick. A silicon nitride layer 324 is then formed by, for example, low pressure chemical vapor deposition to about 100 angstroms to about 300 angstroms, on the first oxide layer 322. Thereafter, the silicon nitride layer 324 and the first oxide layer 322 are etched by means of photolithography and etching to form a plurality of trenches 326, exposing the surface of the substrate 300 where the source regions are to be formed, subsequently The thicknesses of the silicon nitride layer 324 and the first oxide layer 322 can vary according to the requirements of the particular process.

Figure 3B:
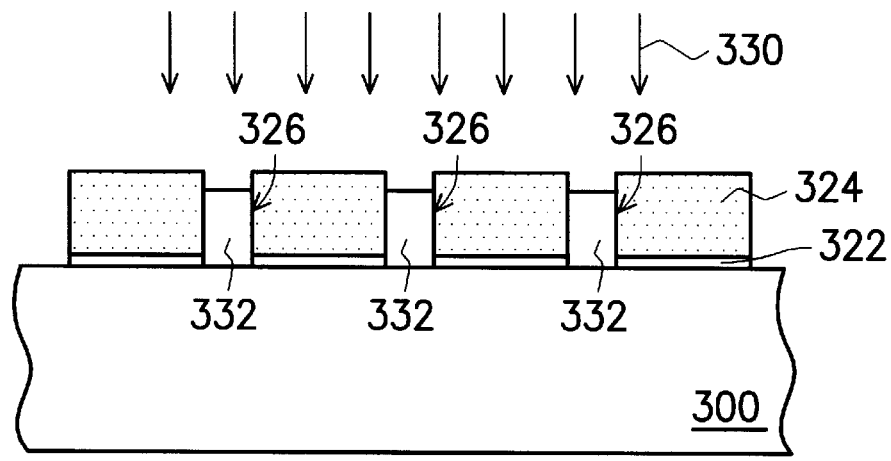

Referring to FIG. 3B, a polysilicon layer (not shown) is formed by, for example, low pressure chemical vapor deposition on the substrate 300 and filling the trenches 326, followed by a back etching or a chemical mechanical polishing process to remove a portion of the polysilicon layer (not shown) Outside the trenches 326, wherein the remaining polysilicon layer 332 is lower than the top of the trenches 326. Thereafter, an N-type ion implantation 330, for example, an arsenic ion implantation or a boron ion implantation, is conducted in-situ to dope the polysilicon layer 332 and to form, in reality, a plurality of the doped polysilicon pillars 332.

Figure 3C:
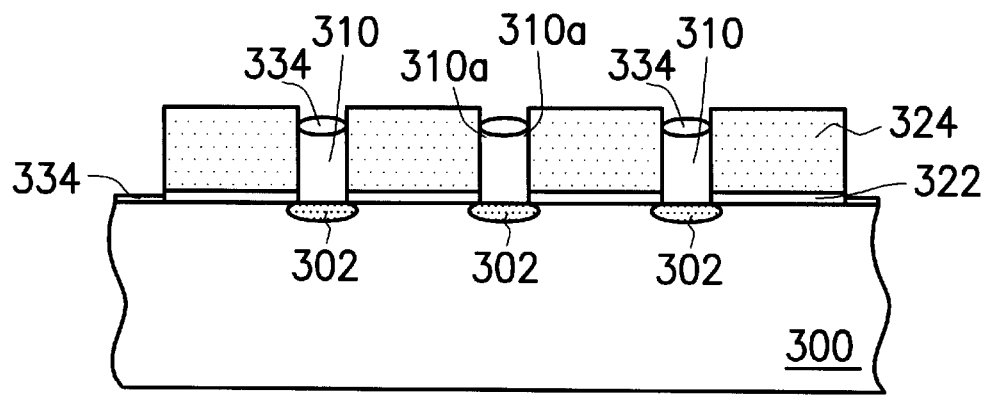

As shown in FIG. 3C, a wet thermal oxidation is conducted to grow another oxide layer 334 on the doped polysilicon pillars 322 (as in FIG. 3B) and on the exposed silicon substrate 300. The doped polysilicon pillars 332 (FIG. 3B) having the oxide layer 334 grown thereon are indicated by reference numeral 310. The wet thermal oxidation process, which is equivalent to an annealing, also results with a portion of the dopants to diffuse from the doped polysilicon pillars 310 into the substrate 300 to form the source regions 302. An important event also occurring in this manufacturing step is that the second oxide layer 334 formed on the top of the polysilicon pillars 310 is thicker in the center while it is thinner at the edge near the silicon nitride layer 324 to result in sharp-cornered 310a doped polysilicon pillars 310. Electrons thus more easily move in and out of the polysilicon pillars 310 through the sharp comers 310a.

The formation of these sharp corners 310a can be explained with by the theory of local oxidation of silicon (LOCOS). The polysilicon layer 322 (as in FIG. 2B) where the second oxide layer is going to be formed on is located between the silicon nitride layers 324. The silicon nitride layers 324 function like the oxidation mask in the LOCOS process, which prevents the oxidants, for example, oxygen and water, from reaching the silicon surface of the polysilicon layer 310. As a result, the oxide layer 334 generated on the edge of polysilicon layer 310 (as in FIG. 3C) near the silicon nitride layer 324 is thinner and the oxide layer 334 generated on the center of the polysilicon layer 310 is thicker. The oxide layer 334 thus resembles a field oxide layer with a bird beak structure. The top of the polysilicon layer 310 then becomes sharpened at the corners next to the silicon nitride layer 324 because of the presence of the bird beak structure of the oxide layer 334.

Although in the preferred embodiment of the present invention, the polysilicon layer 310 becomes sharpened by means of a thermal oxidation process, the invention is also applicable to other techniques for forming the sharp-cornered 310a polysilicon layer 310. For example, if the polysilicon layer 332 (as in FIG. 3B) formed in the trenches 326 (as in FIG. 3B) is removed by chemical mechanical polishing, over-polishing may result with a dishing condition on the polysilicon layer 332 in the trenches. The dishing condition causes the top of the polysilicon layer 310 near the silicon nitride layers 324 to become slightly sharpened.

Figure 3D:
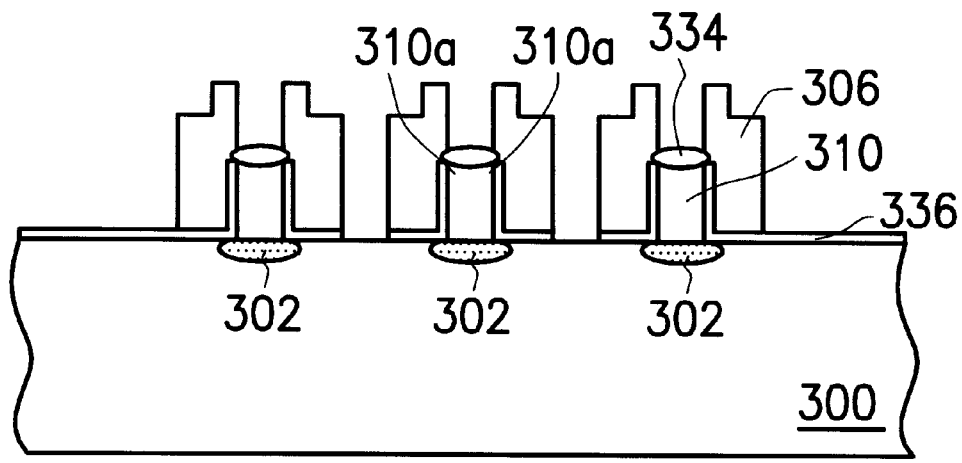

As shown in FIG. 3D, the silicon nitride layer 324 and the underlying oxide layer 322 (as in FIG. 3C) are removed by phosphoric acid and diluted hydrogen fluoride (HF), respectively, leaving the polysilicon pillars 310 oil the source regions 302. As a result, there is one polysilicon pillar 310 on each source regions 302. A first dielectric layer 336, for example, an oxide layer, is then formed on the substrate 300 by, for example, thermal oxidation, covering the source regions 302 and on the sidewalls of the polysilicon pillars. In addition, a thin oxide layer (not shown) may also grow on the second oxide layers 334 due to the heat from the thermal treatment. The thin oxide layer, however, will not affect the result of the present invention. Furthermore, the second oxide layers 334 on the doped polysilicon pillars 310 also play the role of a dielectric material. The thickness and the material used for the first dielectric layer 336 can vary according to the requirements of the different processes.

Still referring to FIG. 3D, after the formation of the first dielectric layer 336, a doped polysilicon layer (not shown in Figure) is formed on the substrate 300. The doped polysilicon layer (not shown in Figure) can form by either in-situ doping or depositing an ion implanted polysilicon, wherein the dopant includes an arsenic ion. The doped polysilicon layer is then patterned, wherein the patterned doped polysilicon layer 306 forms the floating gate 306 of the memory cell.

Figure 3E:
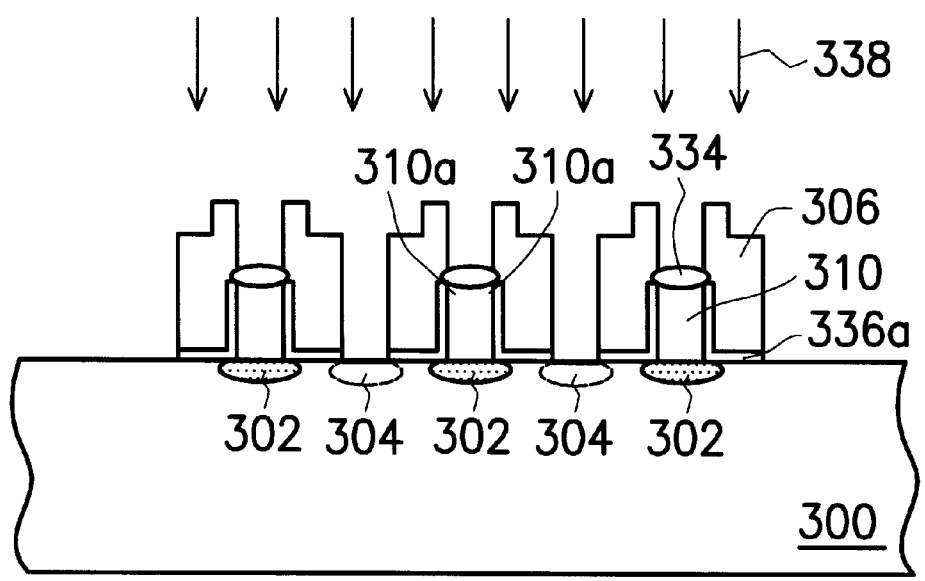

Continuing to FIG. 3E, after forming the patterned doped polysilicon layer 306, an etching is conducted to remove the dielectric layer 336 (FIG. 3D) which is not covered by the doped polysilicon layer 306. The patterned dielectric layer 336a and the doped polysilicon layer 306 expose the substrate between the source regions 302 where a portion of the drain region of the flash memory cell is to be formed, subsequently. The patterned first dielectric layer 336a and the first doped polysilicon layer 306 also partially expose the second oxide layer 334 on the tops of each of the polysilicon pillars 310.

After this, an ion implantation 338 is conducted on the substrate 300 for the subsequent formation of the drain regions 304 using the patterned first doped polysilicon layer 306 and the first dielectric layer 336 as masks.

Figure 3F:
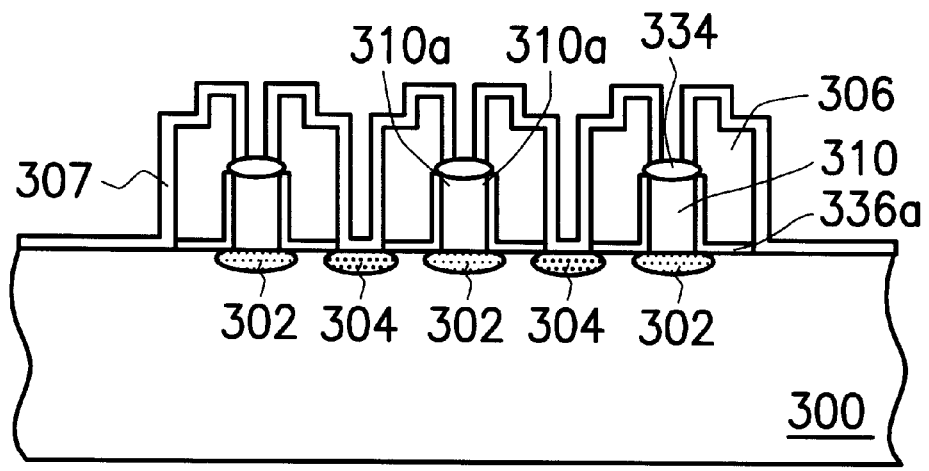

As shown in FIG. 3F, a second dielectric layer 307, for example, an oxide/nitride/oxide (ONO) film, is formed on the first doped polysilicon layer 306. If the second dielectric layer 307 is formed by means of thermal oxidation, an oxide layer is also formed on the exposed substrate 300 surface. If the second dielectric layer 307 is formed by means of deposition, a nitride material may also be deposited on the second oxide layer 334. Since the second oxide layer 334 is also a dielectric material, a deposition of the second dielectric layer 307 thereon (not shown in Figure) has an insignificant effect on the result of the present invention.

After this, a thermal process is conducted to drive-in the implanted dopants to form the drain regions 304 for the memory device. If the second dielectric layer 307 mentioned in the above is formed by means of a thermal treatment, the driving-in of the implanted dopants to form the drain regions 304 can be achieved concurrently. In other words, the same thermal process forms the second dielectric layer 307 and the drain regions 304.

Figure 3G:
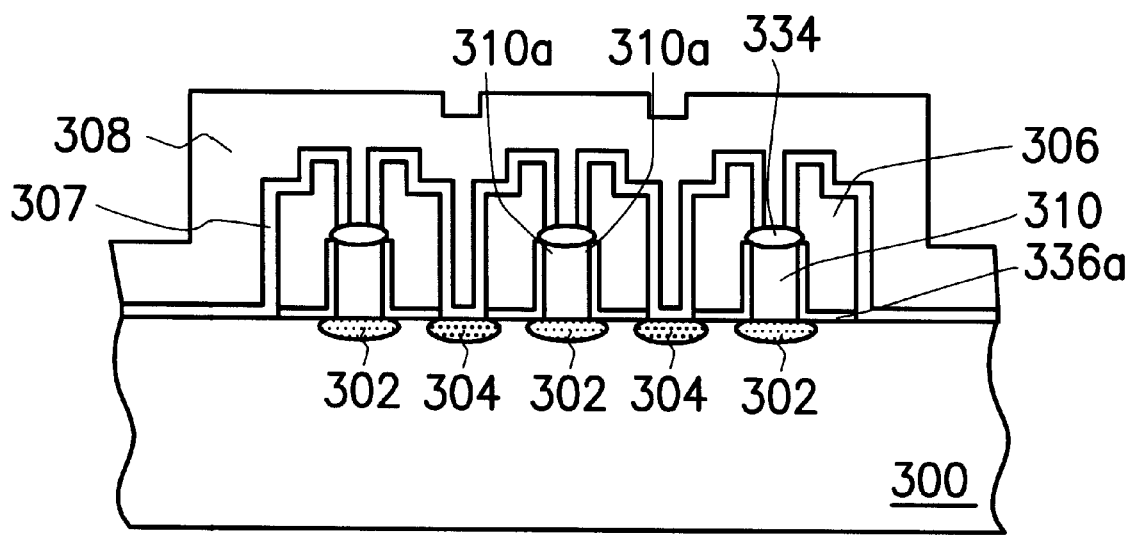

Referring to FIG. 3G, a second doped polysilicon layer (not shown) is formed on the substrate 300 and covering the second dielectric layer 307. The second doped polysilicon layer is then patterned, wherein the patterned second doped polysilicon layer 308 forms the control gate 308. The second doped polysilicon layer can be formed by either an in-situ doping on the polysilicon layer or by depositing a doped polysilicon layer.

The difference between the pre-patterned second doped silicon layer and the patterned second doped polysilicon layer 308 is not obvious from the side-view (as shown in FIG. 3G). The post-patterned second doped polysilicon layer 308, however, when is viewed from the top, shows a plurality of polysilicon blocks with each representing a memory cell.

To better illustrate the advantages of the present invention, a table summarizing the operation conditions of an EEPROM memory cell formed according to the present invention and the two prior arts are summarized in Table 2.

TABLE 2

A comparison of the operating conditions of an EEPROM memory cell formed according to the present invention and formed according to the two prior art cases.

| | Operation | Control Gate | Drain Region | Source Region | Substrate |
|---|---|---|---|---|---|
| prior Art I | Erasure | 20 V | Floating | Grounded | Grounded |
| Prior Art II | Erasure | 10–12 V | Floating | −5 V | −5 V |
| Present Invention | Erasure | 10–12 V | Floating | Grounded | Grounded |

TABLE 3

The programming, reading and erasure conditions of the memory cell formed according to prior art II and the preferred embodiment of the present invention

| | Operations | Control Gate | Drain | Source | Substrate |
|---|---|---|---|---|---|
| Present Invention | Reading | 3–5 V | 1–2 V | Grounded | Grounded |
| | Programming | −8 V | 5 V | Floating | Grounded |
| | Erasure | 10–12 V | Floating | Grounded | Grounded |
| Prior Art II | Reading | 3–5 V | 1–2 V | Grounded | Grounded |
| | Programming | −9 V | 5 V | Floating | Grounded |
| | Erasure | 10–12 V | Floating | −5 V | −5 V |

Compared to prior art I, the required voltage for an erasure operation at the control gate is lower when the EEPROM device is formed according to the preferred embodiment of the present invention. A lower voltage requirement leads to a simpler circuit and manufacturing procedures. Furthermore, a high voltage charge pumping circuit, which is required for a high voltage operation, becomes unnecessary with the EEPROM device formed according to the present invention. In other words, a low voltage requirement also has a spacing result because the high voltage charge pumping circuit occupies a substantial area of the substrate. According to the preferred embodiment of the present invention, the movement of the electrons across the floating gate is facilitated by the sharp-cornered polysilicon pillar which is in conjunction with the source region. As a result the erasure speed is enhanced. The presence of the sharp-cornered polysilicon pillar also significantly reduces the source side resistance of a flash memory device. Since a thick gate oxide layer and a long channel region are required to switch on and off the high voltage, the thickness of the gate oxide layer and the length of the channel region can be reduced with a low voltage operation. Consequently, the manufacturing process is more simplified and the integration density is increased. A low voltage operation is also more compatible with the low power dissipation requirement, and therefore is more applicable for a portable device.

Still referring to Table 2, with the other flash device formed according to prior art II, a negative voltage (about −5V) is applied to the source region for an erasure operation to alleviate the voltage applied to the control gate (reduces to about 10 to 12 V). However, applying a negative voltage to an N-type source region requires a fabrication of a deeper N-well region in the substrate underneath the P-shallow region to isolate the biased P-well region. This type of design occupies a significant area of the silicon substrate and the circuits become more complicated. The memory device formed according to the present invention, on the other hand, only requires the source region and substrate to be grounded. A negative voltage to the source region or the substrate and the formation of a deeper N-well region are thus prevented. Table 3 further summarizes the programming, reading and erasure conditions of the memory cell formed according to prior art II and the preferred embodiment of the present invention.

Generally speaking, the present invention provides a polysilicon pillar in conjunction with the source region, wherein the polysilicon pillar comprises a sharp corner. The electrons pass through the sharp corner more easily to achieve a high erasure speed. The presence of the sharp corner, in which the movement of the electrons is facilitated, also reduces the erasure voltage at the control gate.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A fabrication process for an electrically erasable programmable read only memory cell, the method comprising the steps of:

sequentially forming a first oxide layer and a silicon nitride layer on a substrate;

patterning the silicon nitride layer and the first oxide layer to form a plurality of trenches, exposing a portion of the substrate;

filling the trenches with a first doped polysilicon layer;

forming a sharp corner at a top of the first doped polysilicon layer near the silicon nitride layer;

forming a plurality of source regions in the portion of the substrate under the first doped polysilicon layer, wherein the source regions are electrically connected to the first doped polysilicon layer;

removing the silicon nitride layer and the underlying first oxide layer while leaving the first doped polysilicon layer on the source regions;

sequentially forming a first dielectric layer and a second doped polysilicon layer on the substrate;

patterning the first dielectric layer and the second doped polysilicon layer to expose a portion of the substrate;

implanting ions into the exposed substrate to form a plurality of drain regions; and forming sequentially a second dielectric layer and a patterned third doped polysilicon layer on the substrate, covering the second doped polysilicon layer.

2. The fabrication process for an electrically erasable programmable read only memory cell according to claim 1, wherein the second doped polysilicon layer serves as a floating gate.

3. The fabrication process for an electrically erasable programmable read only memory cell according to claim 1, wherein the third doped polysilicon layer serves as a control gate.

4. The fabrication process for an electrically erasable programmable read only memory cell according to claim 1, wherein the sharp corer at the top of the first doped polysilicon layer is formed by conducting a thermal oxidation to form a second oxide layer on the first doped polysilicon layer, wherein the second oxide layer is thicker in a center and is thinner at an edge near the silicon nitride layer.

5. The fabrication process for an electrically erasable programmable read only memory cell according to claim 1, wherein the sharp corner at the top of the first doped polysilicon layer is formed by chemically mechanically over-polishing the first doped polysilicon layer.

6. The fabrication process for an electrically erasable programmable read only memory cell according to claim 4, wherein the thermal process also drives-in a portion of dopants from the first doped polysilicon layer into the substrate to form the source regions.

7. A fabrication method for an electrically erasable programmable read only memory cell with an enhanced erasure speed and a lower erasure voltage, the method comprising the steps of:

forming a plurality of source regions in a substrate;

forming a plurality of sharp-cornered doped polysilicon pillars on the source regions to electrically connect to the source regions and facilitate the movement of electrons;

forming a first dielectric layer to cover the source regions;

forming a floating gate on the first dielectric layer;

forming a plurality of drain regions in the substrate;

forming a second dielectric layer on the substrate to cover the floating gate; and forming a control gate on the second dielectric layer.

8. The fabrication method for an electrically erasable programmable read only memory cell with an enhanced erasure speed and a lower erasure voltage according to claim 7, wherein the method for forming a plurality of the sharp-cornered doped polysilicon pillars on the source regions further includes:

forming a first oxide layer and a silicon nitride layer;

patterning the first oxide layer and the silicon nitride layer to form a plurality of trenches exposing a surface of the substrate;

filling the trenches with a doped polysilicon layer to form the doped polysilicon pillars;

conducting a thermal oxidation to grow a second oxide layer on the doped polysilicon pillars to form a sharp corner on a top of the doped polysilicon pillars near the silicon nitride layer;

removing the silicon nitride layer and the underlying first oxide layer.

9. The fabrication method for an electrically erasable programmable read only memory cell with an enhanced erasure speed and a lower erasure voltage according to claim 7, wherein the sharp-cornered doped polysilicon pillars are formed concurrently during the formation of the source regions.

10. The fabrication method for an electrically erasable programmable read only memory cell with an enhanced erasure speed and a lower erasure voltage according to claim 7, wherein the method of forming a plurality of the sharp-cornered doped polysilicon pillars on the source regions includes chemically mechanically over-polishing the first doped polysilicon layer.

11. An electrically erasable programmable read only memory cell comprising:

a plurality of source regions in the substrate;

a plurality of sharp-cornered doped polysilicon pillars on the source regions for electrically connecting to the source regions;

a first dielectric layer on the substrate and on the sharp-cornered doped polysilicon pillars;

a floating gate on the first dielectric layer;

a plurality of drain regions in the substrate;

a second dielectric layer on the substrate and on the floating gate; and a control gate on the second dielectric layer.

* * * * *